US007755382B2

(12) United States Patent
Dumitru et al.

(10) Patent No.: US 7,755,382 B2
(45) Date of Patent: Jul. 13, 2010

(54) CURRENT LIMITED VOLTAGE SUPPLY

(75) Inventors: Iulian Dumitru, Bucuresti (RO); Liviu-Mihai Radoias, Ploiesti Prahova (RO); Marilena Mancioiu, Corabia, jud. OLD (RO)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 12/196,983

(22) Filed: Aug. 22, 2008

(65) Prior Publication Data

US 2010/0045343 A1 Feb. 25, 2010

(51) Int. Cl.
*H03K 17/16* (2006.01)
*H03K 19/003* (2006.01)

(52) U.S. Cl. ............................ 326/27; 326/33; 326/34; 323/280; 323/282; 323/316

(58) Field of Classification Search ............. 326/26–27, 326/31, 33–34; 323/280, 282, 316
See application file for complete search history.

(56) References Cited

U.S. PATENT DOCUMENTS

| | | | | |
|---|---|---|---|---|
| 5,225,720 | A | 7/1993 | Kondoh et al. | |
| 6,259,238 | B1 * | 7/2001 | Hastings | 323/280 |
| 6,710,583 | B2 * | 3/2004 | Stanescu et al. | 323/280 |
| 6,804,102 | B2 * | 10/2004 | Hamon et al. | 361/93.3 |
| 7,064,532 | B1 * | 6/2006 | Suzuki | 323/276 |
| 2003/0218454 | A1 * | 11/2003 | Cunnac et al. | 323/316 |
| 2005/0248326 | A1 * | 11/2005 | Bo et al. | 323/274 |
| 2006/0164053 | A1 * | 7/2006 | Walter et al. | 323/282 |

* cited by examiner

*Primary Examiner*—James H. Cho
*Assistant Examiner*—Jason Crawford
(74) *Attorney, Agent, or Firm*—Bever, Hoffman & Harms, LLP; E. Eric Hoffman

(57) ABSTRACT

A current limited voltage supply including a transistor and a capacitor is provided for powering digital logic cells of an integrated circuit. The transistor is connected in a current mirror configuration, such that a constant reference current is mirrored through the transistor to create a first supply current. The transistor is coupled to the digital logic cells and the capacitor. The first supply current is used to charge the capacitor while the digital logic cells are not switching. While the digital logic cells are switching, the capacitor discharges to the digital logic cells, thereby providing the digital logic cells with sufficient energy to implement high-speed switching. The capacitor minimizes voltage fluctuations within in the current limited voltage supply, such that analog circuitry can be reliably powered from a different branch of the same current mirror circuit.

13 Claims, 3 Drawing Sheets

CURRENT LIMITED VOLTAGE SUPPLY

FIELD OF THE INVENTION

The present invention relates to integrated circuits using standard CMOS technology. More specifically, the present invention relates to an integrated circuit having a current limited voltage supply.

RELATED ART

In conventional semiconductor integrated circuit devices, standard digital logic cells are designed to have an output driving capability sufficient to drive an output signal at a selected frequency under worst-case load conditions. As a result, relatively high switching currents will flow through the standard digital logic cells during normal operating conditions, thereby leading to high power consumption. The high switching currents flowing through the standard digital logic cells may also cause noise to be introduced to the power supply lines of the integrated circuit device, thereby adversely affecting operation of the integrated circuit device. To help alleviate these problems, variable current sources have been coupled to standard digital logic cells in order to limit the switching currents.

FIG. 1A is a circuit diagram of a conventional semiconductor integrated circuit device 100 that includes a standard digital logic cell 2*a* structured as a CMOS inverter, a standard digital logic cell 2*b* structured as a NAND gate, and a standard digital logic cell 2*c* structured as a NOR gate. Each of these standard digital logic cells 2*a*-2*c* is coupled to a corresponding variable current source 10*a*-10*c*. Each of the variable current sources 10*a*-10*c* includes a corresponding NMOS transistor 13*a*-13*c*, wherein the drains of these transistors 13*a*-13*c* are connected to the corresponding standard digital logic cells 2*a*-2*c*. The sources of NMOS transistors 13*a*-13*c* are connected to ground, and the gates of NMOS transistors 13*a*-13*c* are commonly connected to bias line 12. The bias line 12 receives a bias voltage $V_B$ from a bias voltage generating circuit, which includes a constant current source 14 and an NMOS transistor 15. The drain and gate of NMOS transistor 15 are connected to the bias line 12, and the source of NMOS transistor is connected to ground. The constant current source 14 causes a constant bias current $I_B$ to flow through NMOS transistor 15, such that the bias voltage $V_B$ is equal to the gate-to-source voltage $V_{GS}$ of NMOS transistor 15. This bias voltage $V_B$ is applied to the gates of NMOS transistors 13*a*-13*c*, thereby limiting the current flowing from each of the standard digital logic cells 2*a*-2*c* to ground. The bias voltage $V_B$ is set to a value that attempts to limit power consumption and noise within standard digital logic cells 2*a*-2*c*.

In order to achieve lower DC current consumption within device 100 (as may be required by certain applications), the variable current sources 10*a*-10*c* must increasingly limit the current flow from the standard cells 2*a*-2*c* to ground. However, if the current flowing from each of the standard digital logic cells 2*a*-2*c* to ground is limited too much, then the circuitry present within the standard digital logic cells 2*a*-2*c* may not operate correctly (i.e., may not be capable of switching at the desired frequency). Thus, the effectiveness of variable current sources 10*a*-10*c* is limited. Semiconductor integrated circuit device 100 is described in more detail in U.S. Pat. No. 5,225,720 to Kondoh et al. (hereinafter, the Kondoh '720 Patent).

Note that the Kondoh '720 Patent describes alternate embodiments for the variable current source 10*a*, which are briefly described below.

FIG. 1B is a circuit diagram which illustrates one alternate embodiment described by the Kondoh '720 Patent. In this alternate embodiment, a variable current source is provided at the Vdd power supply side of each standard digital logic cell (rather than at the ground side of each standard digital logic cell). For example, a variable current source 10*a*', which comprises PMOS transistor 41, is interposed between the Vdd power supply 7 and the standard digital logic cell 2*a*. The gate of PMOS transistor 41 is connected to receive a bias voltage $V_B$, which is provided by bias voltage generating circuit 50. Bias voltage generating circuit 50 includes PMOS transistor 51 and constant current source 14. The bias voltage $V_B$ limits the current flowing from the Vdd supply voltage 7 to the standard digital logic cell 2*a*. Again, the bias voltage $V_B$ is set to a value that attempts to limit power consumption and noise within the standard digital logic cell 2*a*. However, the circuit of FIG. 1B exhibits the same deficiencies as the circuit of FIG. 1A.

FIG. 1C is a circuit diagram which illustrates another embodiment described by the Kondoh '720 Patent. In this alternate embodiment, a variable current source is provided at both the Vdd power supply side and the ground side of each standard digital logic cell. For example, the variable current sources 10*a* and 10*a*' are both coupled to the standard digital logic cell 2*a*. The gate of PMOS transistor 41 is biased by a first bias voltage $V_{B1}$ provided on bias line 12', and the gate of NMOS transistor 13 is biased by a second bias voltage $V_{B2}$ provided on bias line 12. The bias voltages $V_{B1}$ and $V_{B2}$ are provided by bias voltage generating circuit 60, which includes constant current source 14, NMOS transistors 15 and 61 and PMOS transistor 51. The bias voltages $V_{B1}$ and $V_{B2}$ limit the current flowing through the standard digital logic cell 2*a*. Again, the bias voltages $V_{B1}$ and $V_{B2}$ are set to values that limit the power consumption and noise within the standard digital logic cell 2*a*. However, the circuit of FIG. 1C exhibits the same deficiencies as the circuit of FIG. 1A.

It would therefore be desirable to have a method and structure for limiting power consumption and noise within a standard digital logic cell, without preventing the proper operation of the standard digital logic cell.

SUMMARY

Accordingly, the present invention provides a current limited voltage supply, which includes a transistor and a capacitor, for powering digital logic cells of an integrated circuit. The transistor is connected in a current mirror configuration with a bias circuit, such that a constant reference current is mirrored through the transistor to provide a limited supply current. The transistor is coupled to the digital logic cells and the capacitor. The limited supply current is used to charge the capacitor while the digital logic cells are not switching. However, while the digital logic cells are switching, the capacitor discharges to the digital logic cells, thereby providing the digital logic cells with sufficient energy to implement high-speed switching. The capacitor also minimizes voltage fluctuations within in the current limited voltage supply, such that analog circuitry can be reliably powered from a different branch of the same current mirror circuit.

The present invention will be more fully understood in view of the following description and drawings.

DETAILED DESCRIPTION

Figure 1A:
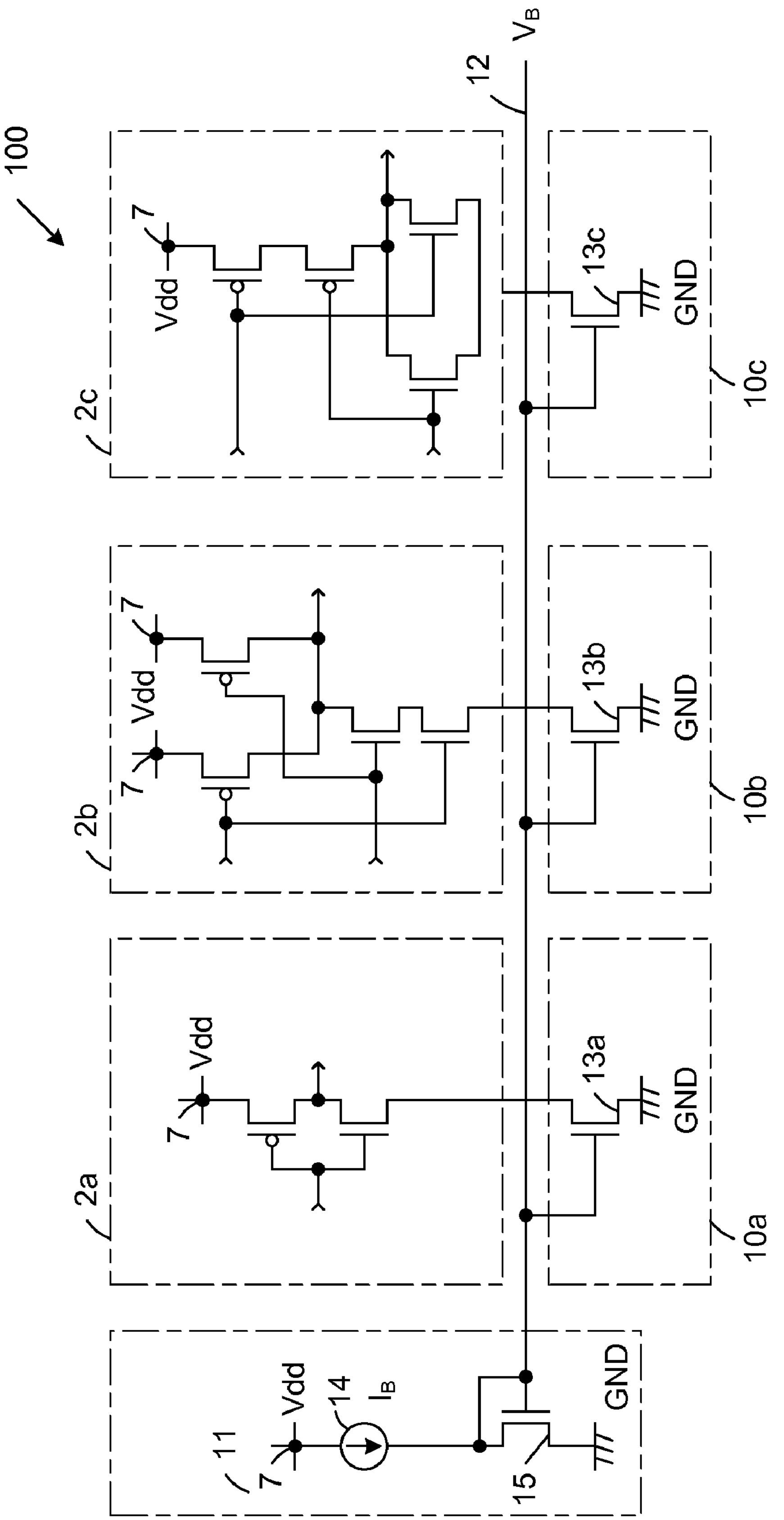
FIG. 1A (PRIOR ART)
FIGS. 1A, 1B and 1C are circuit diagrams of conventional semiconductor integrated circuit devices having variable current sources coupled to standard digital logic cells.
Figure 1B:
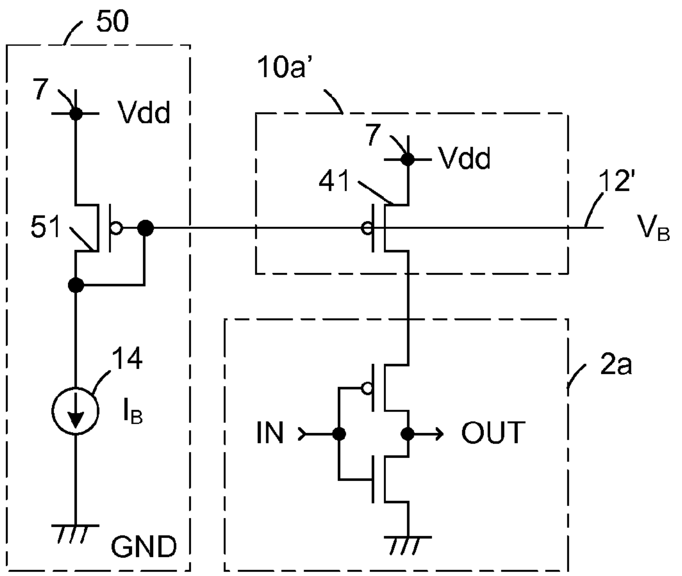
FIG. 1B (PRIOR ART)
Figure 1C:
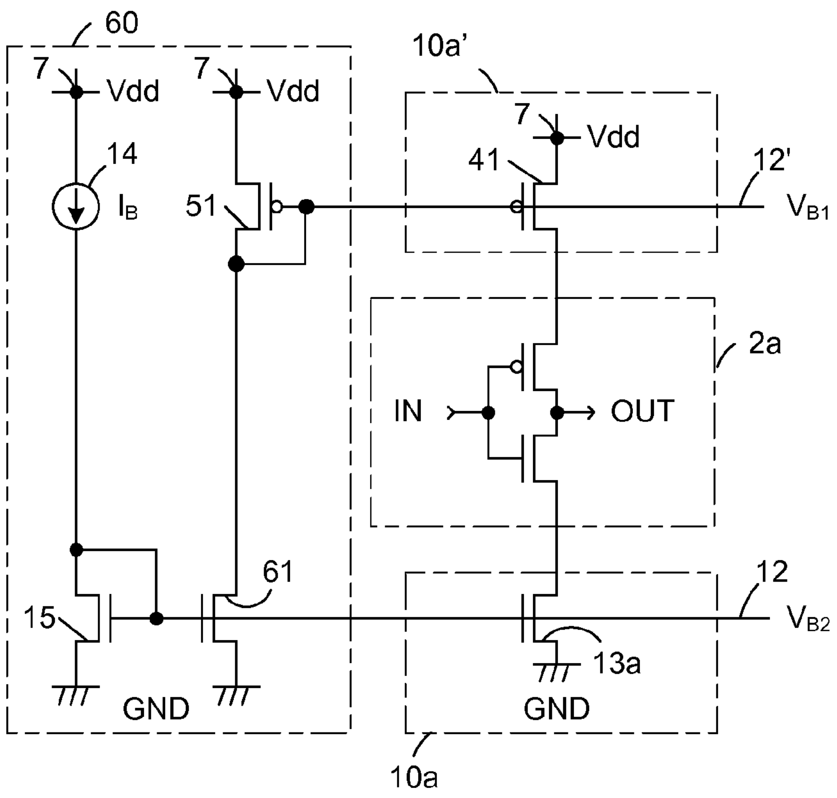
FIG. 1C (PRIOR ART)
Figure 2:
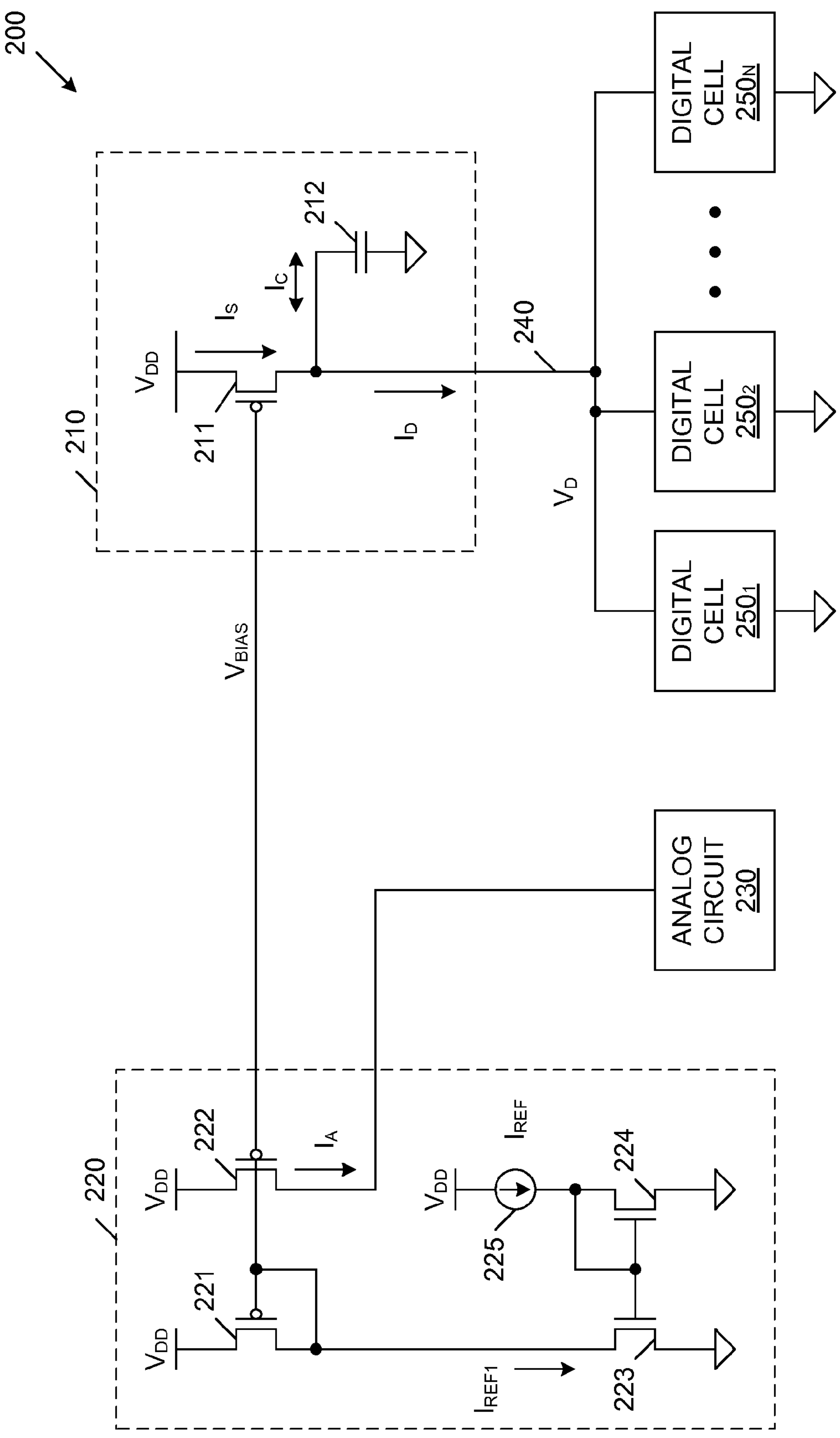
FIG. 2 is a circuit diagram of a semiconductor integrated circuit chip that includes a current limited voltage supply in accordance with one embodiment of the present invention.

FIG. 2 is a circuit diagram of a semiconductor integrated circuit (IC) chip 200 in accordance with one embodiment of the present invention. IC chip 200 includes a current limited voltage supply 210, a bias circuit 220, analog circuit 230, digital cell supply line 240 and standard digital logic cells $\mathbf{250}_1$-$\mathbf{250}_N$. Digital logic cells $\mathbf{250}_1$-$\mathbf{250}_N$ may include, for example, inverters and/or logic gates, which have output signals that switch between logic states in response to one or more input signals. Each of the digital logic cells $\mathbf{250}_1$-$\mathbf{250}_N$ is coupled between the digital cell supply line 240 and ground. As described in more detail below, the digital supply line 240 receives a supply current $I_D$ from the current limited voltage supply 210. A voltage $V_D$ is developed on the digital supply line 240.

In accordance with one embodiment, current limited voltage supply 210 includes a P-channel MOS transistor 211 and an integrated capacitor 212. The source of P-channel MOS transistor 211 is coupled to the $V_{DD}$ (positive) voltage supply rail, the drain of P-channel MOS transistor 211 is coupled to the digital supply line 240, and the gate of P-channel MOS transistor 211 is coupled to receive a bias voltage $V_{BIAS}$ from bias circuit 220. Capacitor 212 includes an electrode connected to the drain of P-channel MOS transistor 211 (and the digital supply line 240), and a counter-electrode connected to ground.

In the described embodiment, bias circuit 220 includes P-channel MOS transistors 221-222, N-channel MOS transistors 223-224 and constant current source 225. Constant current source 225 causes a reference current $I_{REF}$ to flow through N-channel MOS transistor 224. N-channel MOS transistors 223 and 224 are connected in a current mirror configuration, such that the reference current $I_{REF}$ is mirrored to N-channel MOS transistor 223 as the reference current $I_{REF1}$. Note that the relationship between the reference currents $I_{REF}$ and $I_{REF1}$ is determined by the relative sizes of N-channel MOS transistors 223 and 224, in a manner understood by those of ordinary skill in the art. For example, if the N-channel MOS transistors 223 and 224 are identical, then the reference currents $I_{REF}$ and $I_{REF1}$ will be equal.

The reference current $I_{REF1}$ also flows through P-channel MOS transistor 221, which is connected in series with N-channel MOS transistor 223. P-channel MOS transistor 221 is connected in a current mirror configuration with the P-channel MOS transistor 211 of current limited voltage supply 210, such that the reference current $I_{REF1}$ is mirrored to P-channel MOS transistor 211 as the source current $I_S$. Again, the relationship between the reference current $I_{REF1}$ and the source current $I_S$ is determined by the relative sizes of P-channel MOS transistors 221 and 211. Note that the bias voltage $V_{BIAS}$ developed on the gate of P-channel MOS transistor 211 is equal to the $V_{DD}$ supply voltage minus the gate-to-source voltage $V_{GS}$ of P-channel MOS transistor 221.

P-channel MOS transistor 221 is also connected in a current mirror configuration with the P-channel MOS transistor 222, such that the reference current $I_{REF1}$ is mirrored to P-channel MOS transistor 222 as the analog supply current $I_A$. Again, the relationship between the reference current $I_{REF1}$ and the analog supply current $I_A$ is determined by the relative sizes of P-channel MOS transistors 221 and 222. The DC analog supply current $I_A$ is provided to analog circuitry 230 on the same IC chip 200. Analog circuitry 230 may include, for example, current and voltage references, amplifiers, comparators, oscillators, active filters, analog-to-digital converters, digital to analog converters, and other circuits apparent to those of ordinary skill in the art.

Returning now to current limited voltage supply 210, bias circuit 220 limits the digital cell source current $I_S$ to a predetermined value, which is selected in view of the characteristics of digital logic cells $\mathbf{250}_1$-$\mathbf{250}_N$. More specifically, the digital cell source current $I_S$ is selected to minimize the DC current consumption within digital logic cells $\mathbf{250}_1$-$\mathbf{250}_N$, while allowing for proper operation of these digital logic cells. The voltage ($V_D$) developed on the drain of P-channel MOS transistor 211 charges capacitor 212, thereby causing capacitor 212 to store energy that will subsequently be supplied to digital logic cells $\mathbf{250}_1$-$\mathbf{250}_N$. In the described embodiment, the voltage developed on the drain of P-channel MOS transistor 211 is approximately equal to the $V_{DD}$ supply voltage.

Logic transitions in the digital logic cells $\mathbf{250}_1$-$\mathbf{250}_N$ will tend to introduce current spikes in the supply current $I_S$. Such current spikes, left unmitigated, may introduce noise in the current mirror circuitry present in bias circuit 220. Such noise may adversely affect the operation of analog circuit 230.

In accordance with one embodiment of the present invention, capacitor 212 reduces spikes in the supply current $I_S$, which could otherwise result from switching (i.e., logic transitions) within digital logic cells $\mathbf{250}_1$-$\mathbf{250}_N$. More specifically, capacitor 212 stores energy (i.e., a charging current $I_C$ flows into capacitor 212, thereby charging this capacitor) in the intervals between logic transitions in digital logic cells $\mathbf{250}_1$-$\mathbf{250}_N$. During logic transitions in the digital logic cells $\mathbf{250}_1$-$\mathbf{250}_N$, capacitor 212 discharges (i.e., a discharging current $I_C$ flows out of capacitor 212 to digital supply line 240), thereby providing the energy necessary for the digital logic cells $\mathbf{250}_1$-$\mathbf{250}_N$ to switch rapidly, and reducing spiking of the supply current $I_S$. In this manner, capacitor 212 compensates for low DC current within digital logic cells $\mathbf{250}_1$-$\mathbf{250}_N$ during fast logic transitions, thereby assuring that digital logic cells $\mathbf{250}_1$-$\mathbf{250}_N$ operate with a fast transient time and low average power consumption.

Note that by reducing the spiking of the supply current $I_S$, capacitor 212 also reduces voltage fluctuation on supply line 240 during logic transitions within digital logic cells $\mathbf{250}_1$-$\mathbf{250}_N$.

In accordance with one embodiment, the size of capacitor 212 is selected in view of the current $I_S$ supplied by P-channel MOS transistor 211 and the width-to-length (W/L) ratios of the transistors in digital logic cells $\mathbf{250}_1$-$\mathbf{250}_N$, as these parameters will define the current spiking characteristics of the supply current $I_S$. For example, during normal operation of digital logic cells, the switching of digital logic cells $\mathbf{250}_1$-$\mathbf{250}_N$ may result in a current ($I_D$) increase of 100 microAmps during a period of 20 nanoseconds. In this case, capacitor 212 discharges to supply this current. The size of capacitor 212 will determine the voltage fluctuation of supply line 240 under these conditions. For example, to limit the voltage fluctuation to 100 milliVolts, capacitor 212 should have a capacitance of 20 pico-Farads. Note that this determination is made using the equation CV=Q, wherein C is the capacitance of capacitor 212 (in Farads), V is the voltage fluctuation on supply line 240 (in Volts), and Q is the required charge supplied by capacitor 212 during the switching transistion of digital logic cells $\mathbf{250_1}$-$\mathbf{250_N}$ (in coloumbs). Note that the required charge Q is equal to current increase caused by the switching of digital logic cells $\mathbf{250_1}$-$\mathbf{250_N}$ (in Amps) multiplied by time (in seconds).

Although the invention has been described in connection with several embodiments, it is understood that this invention is not limited to the embodiments disclosed, but is capable of various modifications, which would be apparent to one of ordinary skill in the art. Accordingly, the present invention is only limited by the following claims.

We claim:

1. An integrated circuit comprising:

a plurality of digital logic cells that undergo logic transitions during normal operation of the integrated circuit;

a supply line coupled to the digital logic cells, wherein the supply line provides a supply current to the digital logic cells during normal operation of the integrated circuit;

a current limited voltage supply comprising a first transistor coupled between a first voltage supply terminal and the supply line, and a capacitor coupled to the supply line, wherein the capacitor supplies a discharging current to the supply line while the digital logic cells undergo logic transitions; and a bias circuit coupled to the first transistor in a current mirror configuration, whereby a constant reference current within the bias circuit is mirrored to the first transistor.

2. The integrated circuit of claim 1, wherein the capacitor receives a charging current from the first transistor during periods while the digital logic cells do not undergo logic transitions.

3. The integrated circuit of claim 1, wherein the first transistor is a P-channel MOS transistor, and the first voltage supply terminal provides a positive supply voltage.

4. The integrated circuit of claim 1, wherein the capacitor is further coupled to a second voltage supply terminal.

5. The integrated circuit of claim 4, wherein the second voltage supply terminal is a ground supply terminal.

6. The integrated circuit of claim 1 further comprising:

an analog circuit; and a second transistor coupled between the first voltage supply terminal and the analog circuit, wherein the bias circuit is coupled to the second transistor in a current mirror configuration, whereby the constant reference current within the bias circuit is mirrored to the second transistor, such that an analog supply current flows through the second transistor to the analog circuit.

7. The integrated circuit of claim 1, wherein the plurality of digital logic cells exhibit an increase in switching current of $I_D$ (Amps) for a duration of T (seconds) during the logic transitions, wherein the supply line has a desired voltage fluctuation of V (Volts) during normal operation of the integrated circuit, and wherein the capacitor is sized to have a capacitance of $(I_D \times T)/V$.

8. An integrated circuit comprising:

a constant current source that provides a reference current;

a current mirror circuit coupled to the constant current source, wherein the current mirror circuit mirrors the reference current to a first transistor, such that a source current flows through the first transistor;

a plurality of digital logic cells coupled between a drain of the first transistor and a ground supply terminal; and a capacitor coupled between the drain of the first transistor and the ground supply terminal.

9. The integrated circuit of claim 8, wherein the digital logic cells undergo logic transitions during normal operation of the integrated circuit, wherein the capacitor is charged from the source current when the digital logic cells are not undergoing logic transitions, and wherein the capacitor is discharged through the digital logic cells while the digital logic cells are undergoing logic transitions.

10. The integrated circuit of claim 8, further comprising an analog circuit, wherein the current mirror circuit further mirrors the reference current to a second transistor, such that an analog supply current flows through the second transistor, wherein the analog supply current is provided to the analog circuit.

11. The integrated circuit of claim 8, wherein the digital logic cells undergo logic transitions during normal operation of the integrated circuit, wherein the plurality of digital logic cells exhibit an increase in switching current of $I_D$ (Amps) for a duration of T (seconds) during the logic transitions, wherein the supply line has a desired voltage fluctuation of V (Volts) during normal operation of the integrated circuit, and wherein the capacitor is sized to have a capacitance of $(I_D \times T)/V$.

12. A method of operating an integrated circuit comprising:

generating a first supply current by mirroring a constant reference current through a first transistor;

powering digital logic cells of the integrated circuit from the first supply current, wherein the digital logic cells undergo logic transitions during normal operation of the integrated circuit;

charging a capacitor from the first supply current during a first period, wherein the digital logic cells are not undergoing logic transitions during the first period; and discharging the capacitor to the digital logic cells during a second period, wherein the digital logic cells are undergoing logic transitions during the second period.

13. The method of claim 12, further comprising:

generating a second supply current by mirroring the constant reference current through a second transistor; and powering analog circuitry of the integrated circuit from the second supply current.

* * * * *